United States Patent [19]

Mintzer

[11] Patent Number: 5,014,057

[45] Date of Patent: May 7, 1991

[54] CLOCKLESS A/D CONVERTER

[75] Inventor: Lester Mintzer, Santa Ana, Calif.

[73] Assignee: Rockwell International Corporation, El Segundo, Calif.

[21] Appl. No.: 435,905

[22] Filed: Nov. 13, 1989

[51] Int. Cl.$^5$ .............................................. H03M 1/42
[52] U.S. Cl. ...................................... 341/161; 341/158
[58] Field of Search ................ 341/156, 158, 161, 162

[56] References Cited

U.S. PATENT DOCUMENTS

| | | | |
|---|---|---|---|
| 3,638,218 | 1/1972 | Kaneko et al. | 341/162 |
| 4,306,224 | 12/1981 | Geller et al. | 341/161 |
| 4,769,628 | 9/1988 | Hellerman | 341/162 |
| 4,771,266 | 9/1988 | Nurokawa | 341/161 |

Primary Examiner—A. D. Pellinen
Assistant Examiner—Marc S. Hoff
Attorney, Agent, or Firm—H. Fredrick Hamann; George A. Montanye; Gregory D. Ogrod

[57] ABSTRACT

An analog-to-digital converter circuit receives an input signal of a first polarity and a reference voltage of a second polarity. The circuit has a first binary comparator with a resistor divider network connected between the input signal and the reference voltage. The first stage provides a most significant bit signal in response to the absolute value of the input signal exceeding one half the absolute value of the reference voltage. The circuit has at least a second binary bit stage. Each successive binary stage is responsive to the signal voltage and to the logic binary value of all higher order stages. The first and subsequent binary stage provides a binary coded signal with a value corresponding to the ratio of the value of input signal with respect to the value of the reference voltage. The first and second binary stages each have a binary comparator with a first polarity input connected to a reference potential. The first and second binary stages also have a second polarity input, and an output terminal. Each stage has a divider with a first and second resistor. Each resistor has a first and second terminal. The second resistor of each divider has a resistance substantially equal to one half the value of the first resistor. The first resistor first terminal of each divider is connected to the reference voltage. The second resistor first terminal of each divider is connected to the input signal. The first and second resistors' second terminals of each respective divider are common and are connected to the respective comparator second polarity input.

11 Claims, 3 Drawing Sheets

CLOCKLESS A/D CONVERTER

FIELD OF THE INVENTION

This invention relates to the field of linear and digital circuits and particularly to the field of circuits for use in large scale integrated circuits using Field Effect Transistors.

DESCRIPTION OF PRIOR ART

Analog-to-digital conversion entails either synchronous digital control circuits for the application of a successive approximation technique or complex digital decoding logic for very high speed flash converters. The later also requires a precision resistance network of $2^N$ elements, where the integer N represents the number of conversion bits, and the use of $2^N$ comparator circuits. The tolerance of the ratio of resistance values of successive resistors in the network or ladder that is used must be preserved as to all pairs of successive resistance values to avoid ambiguity in the least significant position results. It is understood that conventional synchronous analog-to-digital conversion circuits waste time during the dead time between clock signals.

SUMMARY OF INVENTION

It is therefore a major objective of this invention to provide a high speed analog-to-digital conversion circuit with N simple comparator circuits operating asynchronously. The resistance elements of the N summing nodes require ratiometric accuracy within the node and may be independent from node to node. A basic three or four node configuration can be replicated to achieve higher resolution conversion. The basic configuration of the inventive circuit can serve as a conversion macrocell for VLSI ASIC implementation purposes.

PREFERRED EMBODIMENT

Figure 1:
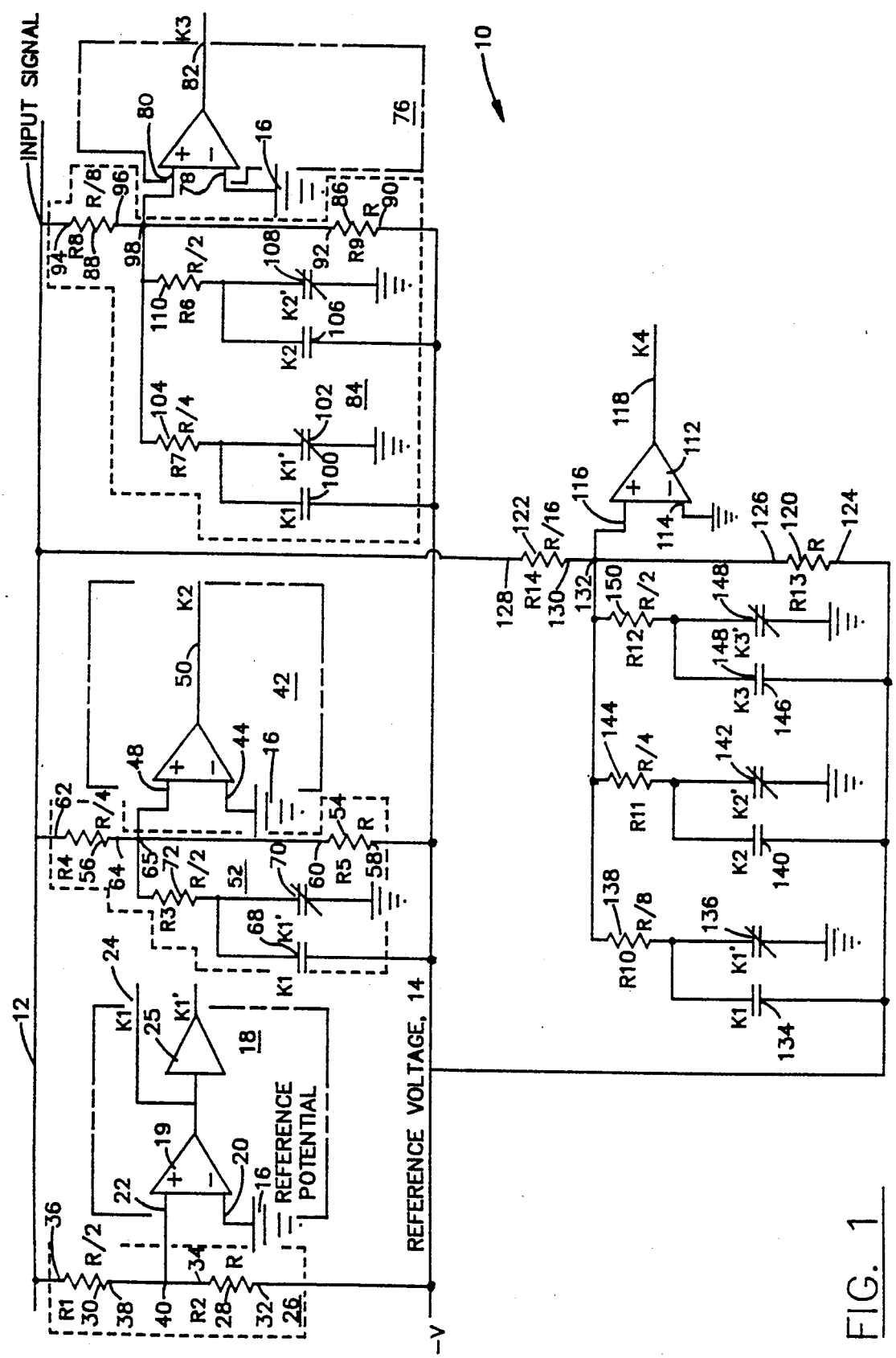
FIG. 1 is a schematic of an A/D circuit according to the present invention, using conventional switching symbols.

FIG. 1 is a schematic of the invention clockless analog-to-digital (A/D) converter circuit 10 responsive to an input signal of a first polarity positive (+), on signal line 12 and to a reference voltage of a second polarity negative (−) on reference voltage line 14 measured with respect to a reference potential such as ground 16. The input signal is a positive uni-polar signal with respect to the reference potential; however, it should be understood that the circuit topology could be adapted to accommodate an arrangement in which the input signal first polarity could be negative (−) if a reference voltage with a positive (+) polarity is used. The reference voltage is typically supplied with extremely high analog accuracy.

As shown in FIG. 1, the clockless analog-to-digital (A/D) converter circuit 10 has a first binary bit stage with a first stage comparator, as in phantom box 18. The first stage comparator 18 uses a conventional comparator 19 and has a first polarity input terminal 20, (−), connected to the reference potential 16. The first stage comparator 18 also has a second polarity input terminal 22, (+), and an output terminal 24 at which the most significant bit (MSB) is provided as logic signal K1.

The most significant binary bit signal is provided as a high logic level, a "one", or a low logic level, a "zero", at the output terminal 24. A logic one output is typically 5.0V and a logic zero is typically 0.0 volts. Both levels are measured with respect to the reference potential 16. The comparator circuit within phantom block 19 is typically a conventional comparator such as an LM 111 or a conventional LM 339 as manufactured by the National Semiconductor Company of Santa Clara, Calif.

Phantom block 26 represents a first stage divider network. The first stage divider 26 has a first resistor 28 and a second resistor 30. The first resistor has a first terminal 32 and a second terminal 34. The second resistor 30 has a first terminal 36 and a second terminal 38. The first resistor first terminal 32 is connected to the reference voltage on signal line 14. The second resistor first terminal 36 is connected to the input signal on signal line 12. The first and second resistors' second terminals are connected in common at a common terminal 40 which is also connected to the first stage comparator second polarity input 22. The first stage divider first resistor 28 has a resistance substantially equal to two times the resistance of the first stage divider second resistor 30.

The first stage comparator 18 provides a logic one at terminal 24 if the input signal rises to a positive value above the absolute half range value of the reference voltage on signal line 14. An inverter 25 is shown coupled to terminal 24 for the purpose of providing the complementary logic level signal K1'. The logic signal at output terminal 24 is a most significant bit (MSB) output signal. The MSB output signal is a logic zero if the input signal on signal line 12 is below the absolute half range value of the voltage reference on signal line 14. By way of example, if the voltage reference is −10.00 Vdc, the output of the first stage will be a logic one for all input signal values in excess of +5.00 Vdc. The output of the first stage will be a logic zero for all input signal values of less than +5.00 volts.

Figure 2:
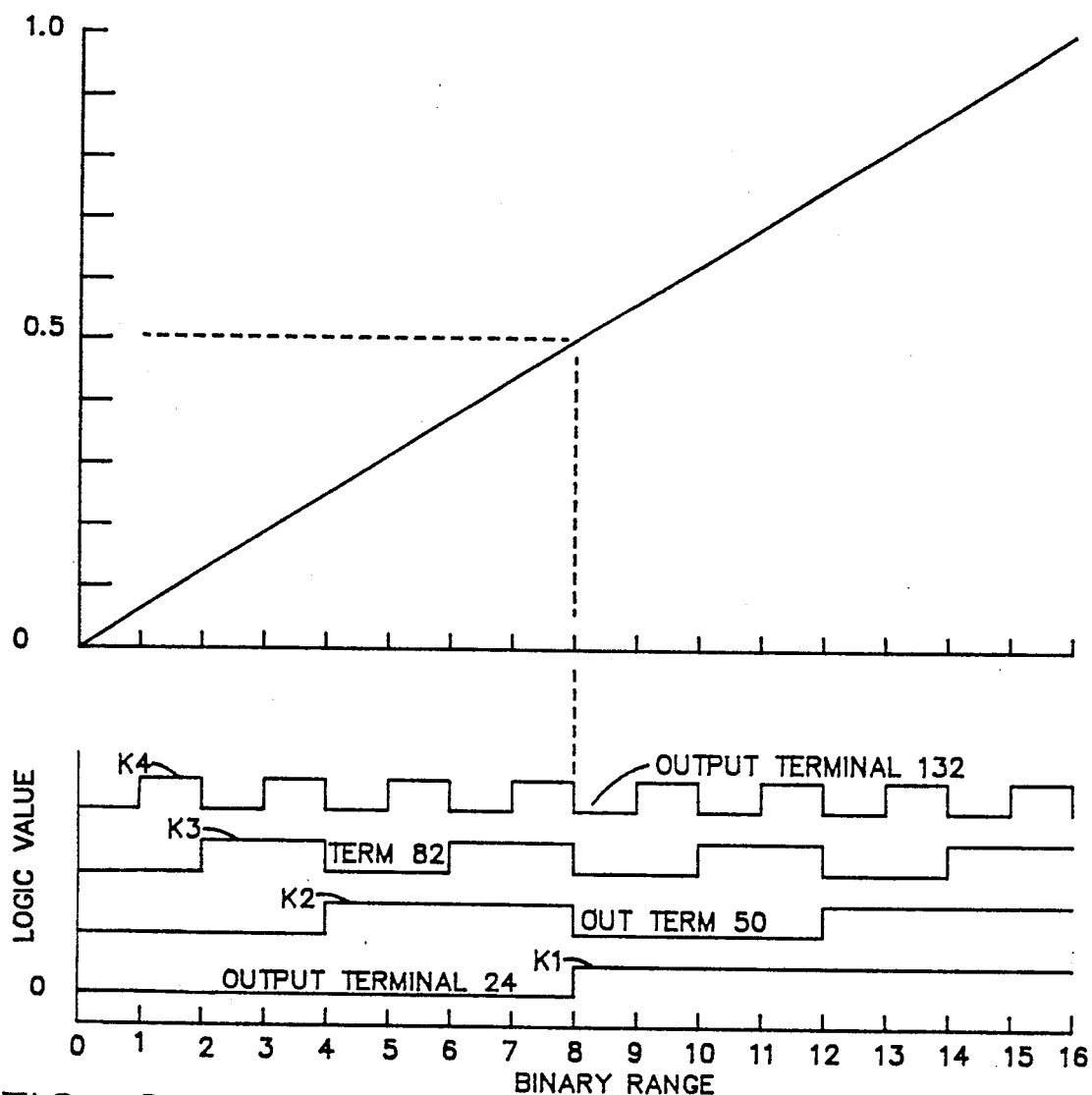
FIG. 2 is a graph of the state of the binary output signals as a function of a ramped input signal.

FIG. 2 shows the state of K1 as a function of an input signal ramp into signal line 12 of FIG. 1. As the ramped input signal amplitude crosses a value equal to 0.5 times the absolute value of the reference voltage on signal line 14, the state of the signal level at terminal 24 changes from a low level to a high level as shown by the logic level line designated K1. The output values of signal levels for K2, K3 and K4 are also shown advancing as a binary count below the increasing value of the ramped signal input.

The invention clockless A/D converter circuit 10 of FIG. 1 has a second stage comparator, represented by the comparator within phantom block 42. The second stage comparator 42 has a first polarity input 44 connected to the reference potential 16, a second polarity input 48, and an output terminal 50. The second most significant binary bit signal for the A/D converter 10, is provided at a the second stage output terminal 50.

A second stage divider within phantom block 52 has a first resistor 54 and a second resistor 56. The first resistor has a first terminal 58 and a second terminal 60. The second resistor 56 has a first terminal 62 and a second terminal 64. The second stage divider first resistor 54 has a resistance substantially equal to four times the value of the resistance of the second stage divider second resistor 56. The first resistor first terminal 58 is connected to the reference voltage on signal line 14. The second resistor first terminal 62 is connected to the input signal on signal line 12. The first and second resistors' second terminals are connected in common at a second stage common terminal 65. The second stage common terminal 65 is connected to the second stage binary bit comparator second polarity input terminal 48.

Figure 3:
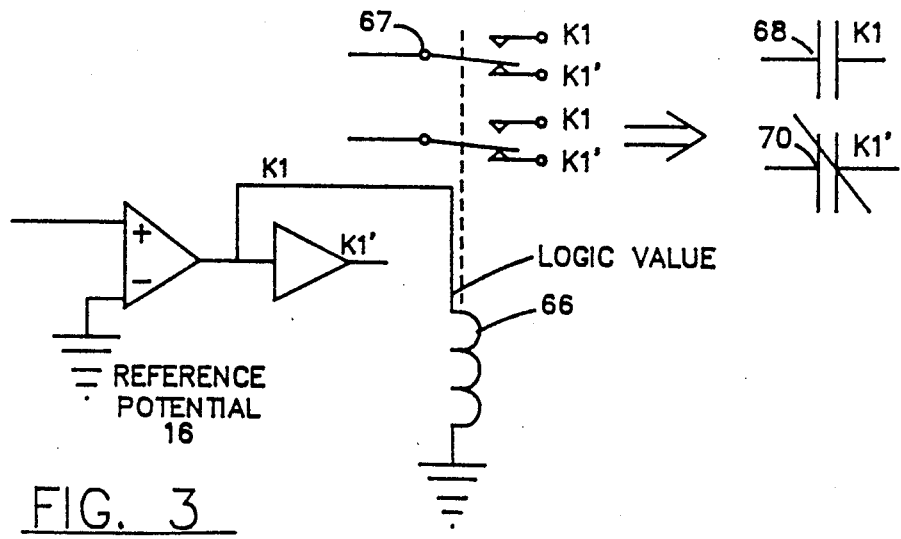
FIG. 3 is a schematic of equivalent switching functions.

FIG. 3 illustrates that the switch closure symbols used in FIG. 1 are functionally equivalent to the use of floated relay contacts. As the K1 logic signal goes high in FIG. 3, relay 66 energizes and operates transferring normally open K1 relay contacts 67 to the closed position. As the K1 logic level goes to a low state, relay 66 de-energizes closing the normally closed K1' contact and opening the K1 normally open contact. Normally open switch closure 68 and normally closed switch closure 70 provide comparable functions. The switch closure symbol 68 indicates that a conduction path is established through the symbol as the K1 term goes high or true. The conduction path is isolated from other circuitry as a relay contact is until connected into the circuit. The symbol for switch closure 68 does not constrain how the closure is made as a function of logic term K1 going true. Normally closed switch closure 70 is closed when K1 is low and opens when K1 goes to the high state.

Figure 4:
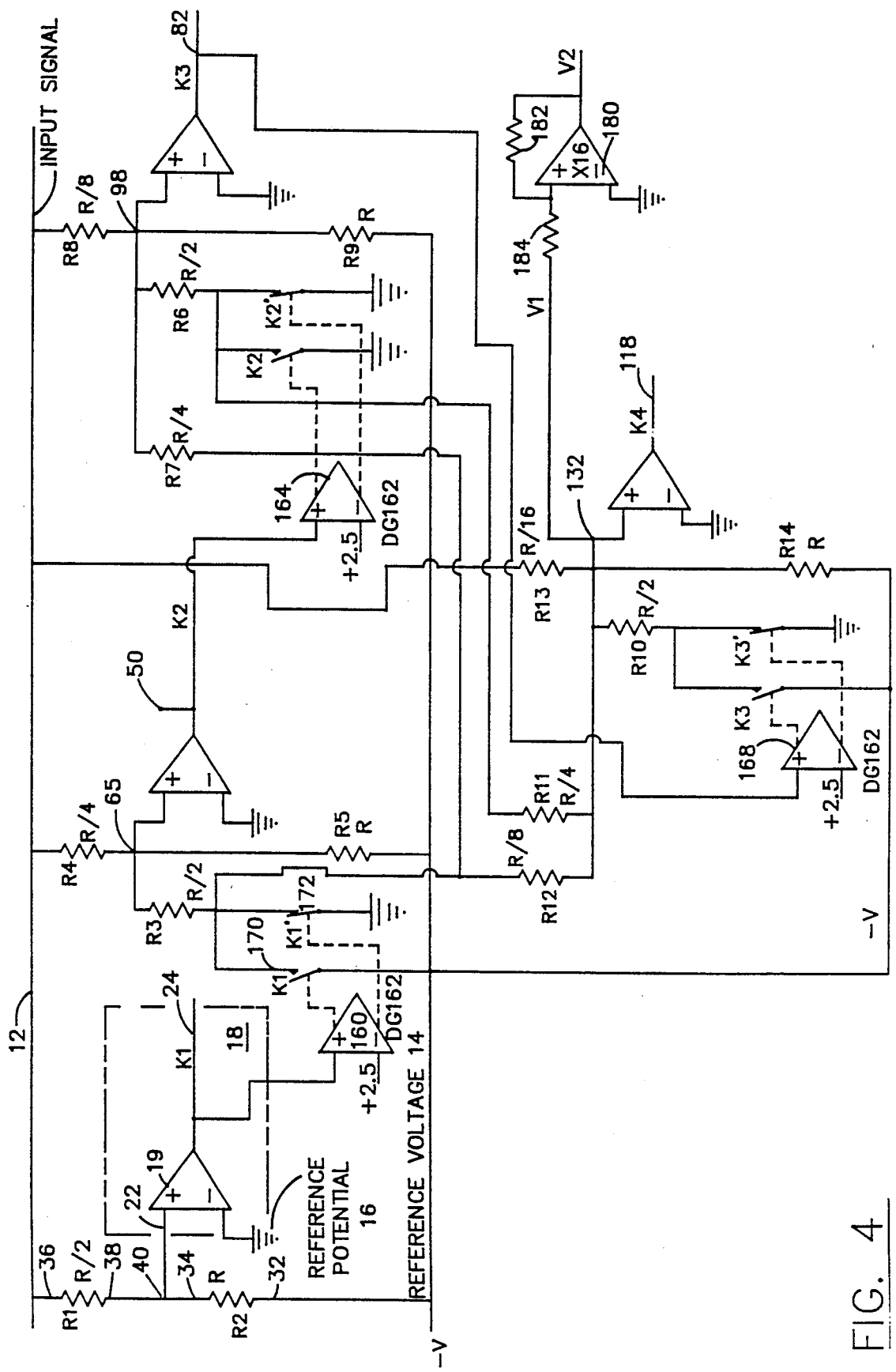
FIG. 4 is a schematic of the circuit of FIG. 1 drawn to eliminate redundant switching functions and to show the addition of a multiplier for connection to a subsequent stage.

Use of the switch closure symbol, as in FIGS. 1 and as illustrated in FIG. 3, implies that a conduction path is established or opened as a function of the state of the logic term named without the necessity of complicating the drawing with relay or semiconductor circuitry. As shown in FIG. 4, an analog switch, such as the DG5042 Monolithic General Purpose CMOS Analog Switch or the DG 162 manufactured by Siliconix Inc. of Santa Clara, Calif., 95954 provide comparable semiconductor conduction path closure functions in response to logic levels K1, K2, and K3.

FIG. 1 will now be discussed in greater detail. As the K1 logic level at terminal 24, goes high, or true, the normally open switch closure 68 closes forming a conduction path to the voltage reference signal path 14. Concurrent with closure of switch closure 68, normally closed switch closure 70 opens opening a conduction path to the reference potential 16. When the K1 logic level at terminal 24 is low, the normally open switch closure 68 is open interrupting the conduction path to the voltage reference 14 and the normally closed switch closure 70 is closed completing a conduction path to the reference potential 16.

The switch closures 68, 70 represent a second stage switching means that is coupled to respond to the voltage at the first stage common terminal 40 exceeding the reference potential 16 or zero volts. When the first stage common terminal 40 has a voltage in excess of the reference potential, the first stage comparator 18 sets the logic level at the MSB terminal 24 to the high state. A high state at 24 operates a relay or an analog switch to establish a conduction path through the normally open K1 68 closure. The normally open switch closure 68 connects a second stage divider fourth resistor R3 72 between the reference voltage 14 and the second stage divider common terminal 65. The second stage first resistor R5, 54 has a resistance substantially equal to two times the resistance of the second stage divider third resistor 56.

The preferred embodiment of the clockless analog to digital converter circuit 10 has at least a third stage comparator as shown within phantom block 76. The third binary stage 76 has a first polarity input 78 connected to the reference potential 16, a second polarity input 80, and an output terminal 82. The third most significant binary bit signal is provided at the third stage comparator output terminal 82.

The third stage has a third stage divider as shown within phantom block 84. The third stage divider 84 has a first resistor R9, 86 and a second resistor R8, 88. The first resistor has a first terminal 90 and a second terminal 92. The second resistor 88 has a first terminal 94 and a second terminal 96. The third stage divider first resistor 86 has a resistance substantially equal to eight times the value of the resistance of the third stage divider second resistor 88. The first resistor first terminal 90 is connected to the reference voltage 14. The second resistor first terminal 94 is connected to the input signal on signal line 12. The first and second resistors' second terminal 92, 96 are connected in common at a third stage common terminal 98 which is also connected to the comparator second polarity input 78.

The third stage switch closures K1 100, K1' 102 represent a third stage first bit switching means responsive to the first stage common terminal 40 having a voltage in excess of the reference potential 16 for connecting a third stage divider third resistor 104 between the reference voltage 14 and the third stage divider common terminal 98. The third stage first resistor 86 has a resistance substantially equal to four times the resistance of the third stage divider third resistor 104.

A more particular embodiment of the clockless analog to digital converter circuit 10 has a third stage second bit switching means comprising switch closures K2, 106; K2' 108. The third stage second bit switching means responds to the second stage common terminal 65 having a voltage in excess of the reference potential 16 for connecting a third stage divider fourth resistor R6. 110 between the reference voltage 14 and the third stage divider common terminal 98. The third stage first resistor R9, 86 has a resistance substantially equal to two times the resistance of the fourth stage divider fourth resistor R6 110.

The clockless analog to digital converter circuit 10 of FIG. 1 has at least a fourth stage binary comparator 112. The fourth binary stage comparator 112 has a first polarity input 114 connected to the reference potential 16, a second polarity input 116, and an output terminal 118. The fourth most significant binary bit signal is provided at a fourth binary comparator output terminal 118.

The fourth stage has a fourth stage divider comprised of two resistors R13, 120 and R14, 122. The fourth stage divider first resistor R13, 120 has a first terminal 124 and a second terminal 126. The second resistor R14, 122 has a first terminal 128 and a second terminal 130. The fourth stage divider first resistor 120 has a resistance substantially equal to sixteen times the value of the resistance of the fourth stage divider second resistor 122. The first resistor first terminal 124 is connected to the reference voltage 14. The second resistor first terminal 128 is connected to the input signal on signal line 12. The first and second resistors' second terminal 126, 130 are connected in common at a fourth stage common terminal 132 which is also connected to the fourth comparator second polarity input 116.

The fourth stage switch closures K1 134, K1' 136 represent a fourth stage first bit switching means responsive to the first stage common terminal 40 having a voltage in excess of the reference potential 16 for connecting a fourth stage divider third resistor R10, 138 between the reference voltage 14 and the fourth stage divider common terminal 132. The fourth stage first resistor 120 has a resistance substantially equal to eight times the resistance of the fourth stage divider third resistor 138.

A fourth stage second bit switching means comprises switch closures K2, 140; K2' 142. The fourth stage second bit switching means responds to the second stage common terminal 65 having a voltage in excess of the reference potential 16 for connecting a fourth stage divider fourth resistor R11, 144 between the voltage reference 14 and the fourth stage divider common terminal 132. The fourth stage divider first resistor R13, 120 has a resistance substantially equal to four times the resistance of the fourth stage divider fourth resistor R11, 144.

A fourth stage third bit switching means comprises switch closures K3, 146; K3', 14. The fourth stage third bit switching means responds to the third stage common terminal 98 having a voltage in excess of the reference potential 16 for connecting a fourth stage divider fifth resistor R12. 150 between the voltage reference 14 and the fourth stage divider common terminal 132. The fourth stage divider first resistor R13, 120 has a resistance substantially equal to two times the resistance of the fourth stage divider fifth resistor R10, 150.

OPERATION

FIG. 4 is an alternative embodiment of the circuit of FIG. 1 that minimizes the component count by recognizing that closures resulting from identical logic signals that connect a component to identical potentials can be combined for the purpose of reducing the number of closures present in the linearized parent topology of FIG. 1.

First, second, third, and fourth comparator and divider stages identical with those in FIG. 1 are present in the circuit of FIG. 4. The respective switching means functions are also present and are shown as second stage switching element 160, third stage switching element 164 and fourth stage switching element 168. These elements are shown mechanized using the previously discussed DG162 devices from Siliconix. The inputs to the DG162 are differential inputs. The positive inputs to the DG162 devices are coupled to the corresponding output terminals of higher order stages. The output levels at the output terminals 24, 50 and 82 are assumed to be conventional +5.0V or 0.0V levels. The inverting inputs to the DG162 devices are connected to a +2.5V bias level to provide adequate signal margin and noise immunity.

The second, third and fourth stage switching elements 160, 164 and 168 respectively, transfer in response to high level logic signals at the corresponding output terminals 24, 50, 82 of the more significant bit stages. The voltage at the common terminals 65, 98, and 132 converge to values closer to the reference potential at 16.

By way of a further explanation, each of the four divider stages are driven by the input signal voltage on signal line 12. As the signal voltage on signal line 12 reaches a value equal to $+V/2$, the voltage at common terminal 40 reaches zero volts and the current through the first stage divider, second resistor R1 equals a value of $V/R$. The current passes from terminal 36 to terminal 38 and then from terminal 34 to terminal 32 to the $-V$ reference potential on signal line 14.

The positive input to the first comparator requires negligible current. If the voltage at the first stage common terminal 40 is zero volts, the current through the first stage divider first resistor R2 is also equal to $V/R$. For an input signal voltage below $V/2$ volts on signal line 12, less current is available at the first stage common terminal 40.

A current less than $V/R$ on terminal 40 results in a voltage at the non-inverting input terminal 22 being below the reference potential. The converse is true for input signal voltages above $V/2$. The difference between the voltage that remains and the reference potential is a first stage residual voltage and it has either a positive or a negative polarity. Comparator 19 must be selected to stand the maximum differential voltage anticipated between input terminal 22 and 20 or an appropriate input and diode clamp protection network must be used.

If the common terminal 65 is at zero volts as a result of the closure of the K1 switch 170, the current leaving the common terminal through R5 is $V/R$ and the current leaving through R3 is $2V/R$. The total current leaving terminal 65 is $3V/R$. The voltage across R4 must exceed $(R/4) \times (3V/R) = 3V/4$ to raise the voltage at common terminal 65 above zero volts.

Conversely, if the K1 switch closure is open, and if the voltage at the common terminal is at zero volts, the same potential is present at both ends of resistor R3 and no current is passing through this component. The current through R5 is $V/R$. Under this set of conditions, the voltage on the input signal line would have to exceed $(V/R) \times (R/4) = V/4$ volts to cause the voltage at common terminal 65 to exceed zero volts. By extending this line of reasoning, it can be shown that the logic signal at the second stage output terminal 50 will be a high level for input signal levels in the ranges of $V/4 - V/2$ and also $3V/4$ to $V$, which is in agreement with the logic level for K2 depicted in FIG. 2 for a four stage system.

Referring again to the second stage, as the input signal on signal line 12 approaches $V/2$ from a value slightly below $V/2$, the switch closure K1 is open and resistor R3 is connected to the reference potential via normally closed switch closure 172.

The same analytical approach can be used to show that the voltage at the third stage common terminal 98 will be above zero volts for input voltages in the ranges of $V/8 - V4$, $3V/8 - V/2$, $5V/B - 3V/4$ and $7V/8 - V$. These ranges are characterized as the positive regions for the K3 term in FIG. 2.

A similar analytical process can be used to show that the fourth stage common terminal 132 will be positive with respect to ground in the positive regions defined by the K4 logic term in FIG. 2.

Amplifier 180 has a gain of 16 determined by the ratio of the feedback resistor 182 to the input resistor 184. Amplifier 180 amplifies the residual voltage at common terminal 132 by a factor that is sufficient to restore the value of the residual to a level that can be processed by a subsequent stage identical to the first stage that is also referenced to $-V$. Additional stages identical to the second, third and fourth stages can be positioned in serial fashion to increase the resolution of the circuit. The ability to add identical stages in series with the first four stages with circuit modules identical to or similar to the first four stage circuit for the purpose of increasing the resolution is a cost saving and a reliability advantage. Reducing the complexity of a design tends to enhance reliability as a general rule.

I claim:

1. A clockless analog to digital converter circuit responsive to an input signal of a first polarity and to a reference voltage of a second polarity measured with respect to a reference potential comprising:

a first binary stage having a first stage comparator and a first stage divider network connected between the input signal and the reference voltage for providing a most significant bit logic signal in response to the absolute value of the input signal exceeding one half the absolute value of the reference voltage; and, at least a second binary stage having a second stage comparator and a second stage divider network, the second and each subsequent binary stage being responsive to the signal voltage and to the logic binary value of all higher order binary stage logic signals; with the first and subsequent binary stages are connected to provide a binary coded digital signal having a value corresponding to the ratio of the first polarity value of the input signal with respect to the second polarity value of the reference voltage.

2. A clockless analog to digital converter circuit responsive to an input signal of a first polarity and to a reference voltage of a second polarity measured with respect to a reference potential comprising:

a first binary stage having a first stage comparator which provides a most significant bit logic signal in response to the absolute value of the input signal exceeding one half the absolute value of the reference voltage said comparator having a first polarity input connected to the reference potential, a second polarity input, and an output terminal, the most significant binary bit signal being provided at the output terminal;

a first stage divider network connected between the input signal and the reference voltage which has a first and second resistor, each resistor having a first and second terminal, the second resistor having a resistance substantially equal to one half the value of the first resistor, the first resistor first terminal being connected to the reference voltage, the second resistor first terminal being connected to the input signal, the first and second resistors' second terminals being connected to a first stage common terminal and to the first stage comparator second polarity input; and at least a second binary stage having a second stage comparator and a second stage divider network, the second and each subsequent binary stage being responsive to the signal voltage and to the logic binary value of all higher order binary stage logic signals, with the first and subsequent binary stages being connected so as to provide a binary coded digital signal having a value corresponding to the ratio of the first polarity value of the input signal with respect to the second polarity value of the reference voltage.

3. The clockless analog to digital converter circuit of claim 2 wherein the second binary stage second stage comparator comprises:

a first polarity input connected to the reference potential, a second polarity input, and an output terminal, the second most significant binary bit signal being provided at the output terminal; and wherein.

the second stage divider has a first and second resistor, each resistor having a first and second terminal, the second resistor having a resistance substantially equal to one fourth the value of the first resistor, the first resistor first terminal being connected to the reference voltage, the second resistor first terminal being connected to the input signal, the first and second resistors' second terminals being connected to a second stage common terminal and to the second stage comparator second polarity input; and, a second stage switching means responsive to the first stage common terminal having a voltage in excess of the reference potential for connecting a second stage divider third resistor between the reference voltage and the second stage divider common terminal, the second stage third resistor having a resistance substantially equal to one half the resistance of the second stage divider first resistor.

4. The clockless analog to digital converter circuit of claim 3 further comprising at least a third binary stage having a third stage comparator and a third stage divider network, the second and each subsequent binary stage being responsive to the signal voltage and to the logic binary value of all higher order binary stage logic signals.

5. The clockless analog to digital converter circuit of claim 4 wherein the third stage comparator further comprises:

a first polarity input connected to the reference potential, a second polarity input, and an output terminal, the most significant binary bit signal being provided at the output terminal; and wherein, the third stage divider has a first and second resistor, each resistor having a first and second terminal, the second resistor having a resistance substantially equal to one half the value of the first resistor, the first resistor first terminal being connected to the reference voltage, the second resistor first terminal being connected to the input signal, the first and second resistors' second terminals being connected to a third stage common terminal and to the third stage comparator second polarity input; and, a third stage switching means responsive to the first stage common terminal having a voltage in excess of the reference potential for connecting a third stage divider third resistor between the reference voltage and the third stage divider common terminal, the second stage third resistor having a resistance substantially equal to one fourth the resistance of the third stage divider first resistor.

6. The clockless analog to digital converter circuit of claim 1 wherein the first binary stage first stage comparator comprises:

a first polarity input connected to the reference potential, a second polarity input, and an output terminal, the most significant binary bit signal being provided at the output terminal; and wherein, the first stage divider has a first and second resistor, each resistor having a first and second terminal, the second resistor having a resistance substantially equal to one half the value of the first resistor, the first resistor first terminal being connected to the reference voltage, the second resistor first terminal being connected to the input signal, the first and second resistors' second terminals being connected to a first stage common terminal and to the first stage comparator second polarity input; and wherein, the second binary stage second stage comparator further comprises:

a first polarity input connected to the reference potential, a second polarity input, and an output terminal, the second most significant binary bit signal being provided at the output terminal; and wherein, the second stage divider has a first and second resistor, each resistor having a first and second terminal, the second resistor having a resistance substantially equal to one fourth the value of the first resistor, the first resistor first terminal being connected to the reference voltage, the second resistor first terminal being connected to the input signal, the first and second resistors' second terminals being connected to a second stage common terminal and to the second stage comparator second polarity input; and, a second stage switching means responsive to the first stage common terminal having a voltage in excess of the reference potential for connecting a second stage divider third resistor between the reference voltage and the second stage divider common terminal, the second stage third resistor having a resistance substantially equal to one half the resistance of the second stage divider first resistor.

7. The clockless analog to digital converter circuit of claim 6 further comprising:

at least a third binary stage having a third stage comparator and a third stage divider network, the second and each subsequent binary stage being responsive to the signal voltage and to the logic binary value of all higher order binary stage logic signals.

8. The clockless analog to digital converter circuit of claim 7 wherein the third stage comparator further comprises:

a first polarity input connected to the reference potential, a second polarity input, and an output terminal, the most significant binary bit signal being provided at the output terminal; and wherein, the third stage divider has a first and second resistor, each resistor having a first and second terminal, the second resistor having a resistance substantially equal to one half the value of the first resistor, the first resistor first terminal being connected to the reference voltage, the second resistor first terminal being connected to the input signal, the first and second resistors' second terminals being connected to a third stage common terminal and to the third stage comparator second polarity input; and, a third stage switching means responsive to the first stage common terminal having a voltage in excess of the reference potential for connecting a third stage divider third resistor between the reference voltage and the third stage divider common terminal, the second stage third resistor having a resistance substantially equal to one fourth the resistance of the third stage divider first resistor.

9. A clockless analog to digital converter circuit responsive to an input signal of a first polarity and to a reference voltage of a second polarity measured with respect to a reference potential comprising:

a first stage comparator having a first polarity input connected to the reference potential, a second polarity input, and an output terminal, the most significant binary bit signal being provided at the output terminal;

a first stage divider having a first and second resistor, each resistor having a first and second terminal, the first resistor first terminal being connected to the reference voltage, the second resistor first terminal being connected to the input voltage, the first and second resistors' second terminals being connected to a first stage common terminal and connected to the comparator second polarity input, the first stage divider first resistor having a resistance substantially equal to two times the resistance of the first stage divider second resistor;

a second stage comparator having a first polarity input connected to the reference potential, a second polarity input, and an output terminal, the second most significant binary bit signal being provided at the second stage comparator output terminal;

a second stage divider having a first and second resistor, each resistor having a first and second terminal, the second stage divider first resistor having a resistance substantially equal to four times the value of the resistance of the second stage divider second resistor, the first resistor first terminal being connected to the reference voltage, the second resistor first terminal being connected to the input signal, the first and second resistors' second terminals being connected to a second stage common terminal and to the second stage comparator second polarity input;

a second stage switching means responsive to the first stage common terminal having a voltage in excess of the reference potential for connecting a second stage divider third resistor between the reference voltage and the second stage divider common terminal, the second stage first resistor having a resistance substantially equal to two times the resistance of the second stage divider third resistor;

at least a third stage comparator having a first polarity input connected to the reference potential, a second polarity input, and an output terminal, the third most significant binary bit signal being provided at the third stage comparator output terminal;

a third stage divider having a first and second resistor, each resistor having a first and second terminal, the third stage divider first resistor having a resistance substantially equal to eight times the value of the resistance of the third stage divider second resistor, the first resistor first terminal being connected to the reference voltage, the second resistor first terminal being connected to the input signal, the first and second resistors' second terminals being connected to a third stage common terminal and connected to the comparator second polarity input; and, a third stage switching means responsive to the first stage common terminal having a voltage in excess of the reference potential for connecting a third stage divider third resistor between the reference voltage and the third stage divider common terminal, the third stage third resistor having a resistance substantially equal to one fourth the resistance of the third stage divider first resistor.

10. The clockless analog to digital converter circuit of claim 9 wherein the third stage first switching means further comprises:
a third stage second switching means responsive to the second stage common terminal having a voltage in excess of the reference potential for connecting a third stage divider fourth resistor between the reference voltage and the third stage divider common terminal, the third stage divider fourth resistor having a resistance substantially equal to one half the resistance of the third stage divider first resistor.

11. The clockless analog to digital converter circuit of claim 10 wherein the third stage first switching means is further characterized to be responsive to the first stage common terminal having a voltage below the reference potential for connecting the third stage divider third resistor between the reference potential and the third stage divider common terminal; and wherein, the third stage second switching means is further characterized to be responsive to the second stage common terminal having a voltage below the reference potential for connecting the third stage divider fourth resistor between the reference voltage and the third stage divider common terminal.

* * * * *